United States Patent
Tom et al.

(10) Patent No.: US 9,026,821 B2
(45) Date of Patent: May 5, 2015

(54) OPTIMIZING POWER CONSUMPTION OF A DIGITAL CIRCUIT

(75) Inventors: Van Assche Tom, Lane Cove (AU); Van Straaten Bram, Lane Cove (AU); Janssens Mark, Lane Cove (AU)

(73) Assignee: Cochlear Limited, Macquarie University, NSW (AU)

( * ) Notice: Subject to any disclaimer, the term of this patent is extended or adjusted under 35 U.S.C. 154(b) by 864 days.

(21) Appl. No.: 12/865,860

(22) PCT Filed: Jan. 30, 2009

(86) PCT No.: PCT/AU2009/000096
§ 371 (c)(1),
(2), (4) Date: Nov. 29, 2010

(87) PCT Pub. No.: WO2009/094709
PCT Pub. Date: Aug. 6, 2009

(65) Prior Publication Data
US 2011/0063022 A1    Mar. 17, 2011

(30) Foreign Application Priority Data
Feb. 1, 2008    (AU) ................................. 2008900448

(51) Int. Cl.
*G06F 1/32*    (2006.01)
*H03L 7/00*    (2006.01)

(52) U.S. Cl.
CPC ............... *H03L 7/00* (2013.01); *G06F 1/3203* (2013.01); *G06F 1/324* (2013.01); *G06F 1/3296* (2013.01); *H04R 2460/03* (2013.01); *Y02B 60/1217* (2013.01); *Y02B 60/1285* (2013.01)

(58) Field of Classification Search
CPC ..... G06F 1/3206; G06F 1/324; G06F 1/3296; Y02B 60/1217; Y02B 60/1285; H03L 7/00; H04R 2460/03
See application file for complete search history.

(56) References Cited

U.S. PATENT DOCUMENTS 6,741,715 B2    5/2004    Andersen
7,205,805 B1    4/2007    Bennett
(Continued)

FOREIGN PATENT DOCUMENTS

CA    2400089 A1    4/2001
CA    2396437 A1    7/2001
(Continued)

OTHER PUBLICATIONS

Wei et al. "A Variable Frequency Parallel I/O Interface" IEEE Journal of Solid-State Circuits, vol. 35, No. 11, Nov. 2000.
(Continued)

*Primary Examiner* — Dennis M Butler

(57) ABSTRACT

A method is provided for optimizing power consumption of a digital circuit which provides operational functionality based upon operating demands. The digital circuit is subject to a supply voltage level and a clock frequency. The method includes determining an acceptable delay value, from a plurality of predetermined acceptable delay values, for the digital circuit based upon current operating demands and the clock frequency. The supply voltage level and the clock frequency are applied to a delay monitor circuit. The delay experienced by the delay monitoring circuit is measured. The measured delay is compared with the determined acceptable delay value. Based on the outcome of the comparing step, the supply voltage level applied to the digital circuit is selectively adjusted. An arrangement for implementing the method is also provided.

21 Claims, 9 Drawing Sheets

(56) References Cited

U.S. PATENT DOCUMENTS

| | | | |
|---|---|---|---|
| 7,289,921 B1 | 10/2007 | Salmi et al. | |
| 7,602,166 B1 * | 10/2009 | Kang | 323/283 |
| 2002/0196957 A1 | 12/2002 | Andersen | |
| 2004/0247148 A1 | 12/2004 | Pedersen | |
| 2006/0048041 A1 | 3/2006 | Linz | |
| 2007/0096775 A1 * | 5/2007 | Elgebaly et al. | 327/105 |
| 2008/0282102 A1 * | 11/2008 | Reddy et al. | 713/323 |

FOREIGN PATENT DOCUMENTS

| | | |
|---|---|---|
| EP | 1432284 A2 | 6/2004 |
| WO | 0122790 A2 | 4/2001 |
| WO | 0150812 A1 | 7/2001 |
| WO | 03026348 A1 | 3/2003 |
| WO | 2005124516 A2 | 12/2005 |
| WO | 2006073845 A2 | 7/2006 |
| WO | 2007053839 A2 | 5/2007 |

OTHER PUBLICATIONS

Nakai et al. "Dynamic Voltage and Frequency Management for a Low-Power Embedded Microprocessor," IEEE Journal of Solid-State Circuits, vol. 40, No. 1, Jan. 2005.

International Search Report, PCT/AU2009/000096, mailed Mar. 12, 2009.

Written Opinion, PCT/AU2009/000096, mailed Mar. 12, 2009.

\* cited by examiner

| CLOCK SPEED | DELAY_OK | V_START |
|---|---|---|
| 1 Mz | 127 | 0.7 V |
| 2 Mz | 50 | 0.8 V |
| 5 Mz | 25 | 0.9 V |

Fig. 8.

OPTIMIZING POWER CONSUMPTION OF A DIGITAL CIRCUIT

CROSS-REFERENCE TO RELATED APPLICATIONS

The present application is a National Stage application of PCT/AU2009/000096 entitled "An Apparatus and Method For Optimising Power Consumption Of A Digital Circuit", filed on Jan. 30, 2009, which claims priority from Australian Provisional Patent Application No. 2008900448, filed on Feb. 1, 2008, which are hereby incorporated by reference herein.

BACKGROUND

1. Field of the Invention

The present invention relates generally to digital circuitry, and more particularly, to the management of power consumption of digital circuitry.

2. Related Art

In many electronic applications, and in particular in the medical device field, power consumption is an important consideration in product design. With respect to implantable medical devices, power consumption can be a critical issue. The power for an implanted device can be supplied from an external device through the skin using a wireless link or percutaneous lead, or, alternatively it can be supplied via an implantable battery. In each case, the available power within the implant is limited. As such, to provide the implant with a sufficiently useful operating lifetime, the limitations on the power supply push demands to lower the power consumption of the device.

One way to reduce the power consumption is to reduce the supply voltage of digital circuitry such as is found on an integrated circuit (IC). However, reducing the supply voltage produces consequential drawbacks. When reducing the supply voltage, the delay of the digital cells increases and as a result the timing of the circuitry becomes a critical consideration. As such, for digital circuitry, there may be a lowest threshold supply voltage level which provides optimum power consumption. However, going below such a threshold would result in the circuit not meeting the timing which is necessary for the designed function of the circuit. Such an optimal point would be dependent on the IC processing, the specific IC parameters, temperature, aging of the device, the patient's settings and operating demands. Hence, the supply voltage level which provides the optimal power consumption can differ from chip to chip. Further, the optimum supply voltage level for the one circuit will change dynamically as operating demands will change depending upon a patient's requirements.

An example of a conventional implantable hearing system is illustrated in FIG. 1. The system consists of an external part 12 and an internal part 14 (i.e. the so-called implant). External and internal parts 12, 14 communicate with each other using a wireless link 16 through the skin. Both internal and external parts 12, 14 can consist of one or multiple components. For example, an external sound processor 18, for capturing the microphone signal and conditioning the signal before sending it to the implant 20. Other external components could be a remote control 22, a programming interface, a diagnostics device, additional microphones, etc. The internal part 20 typically has a stimulator component that is responsible for stimulating the auditory nerve. Internal components may also include an implantable battery, implantable microphone, a receiver for a wireless link, etc.

As shown, each component can include a number of ICs which provide different required functions. In the illustrated example, the sound processor 18, as well as the implant 20, each includes a digital IC 24, 26. Such an IC can contain some analog blocks, but the majority of the IC consists of digital logic and memories.

SUMMARY

In one aspect of the present invention, a method for optimizing power consumption of a digital circuit which provides operational functionality based upon operating demands, wherein said digital circuit is subject to a supply voltage level and a clock frequency is disclosed. The method comprises: determining an acceptable delay value for said digital circuit based upon current operating demands and said clock frequency; applying said supply voltage level and said clock frequency to a delay monitor circuit; measuring the delay experienced by said delay monitoring circuit; comparing said measured delay with said determined acceptable delay value; and adjusting said supply voltage level applied to said digital circuit based on the outcome of said comparison of said measured and acceptable delay.

In a second aspect of the present invention, an arrangement for optimising power consumption of a digital circuit which provides operational functionality based upon operating demands, wherein said digital circuit is subject to a supply voltage level and a clock frequency is disclosed. The arrangement includes: means for determining an acceptable delay value, from a plurality of predetermined acceptable delay values, for said digital circuit based upon current operating demands and said clock frequency; a delay monitor circuit arranged to have said supply voltage level and said clock frequency applied, wherein said delay monitor circuit provides an output from which the delay experienced by said delay monitor circuit is capable of being derived; a supply voltage controller arranged to selectively adjust the supply voltage level applied to said digital circuit based upon the difference between the derived delay and the determined acceptable delay.

BRIEF DESCRIPTION OF THE DRAWINGS

Illustrative embodiments of the present invention will now be described with reference to the accompanying drawings, in which:

FIG. 8 shows an example of a look-up table providing different predetermined acceptable delays.

DETAILED DESCRIPTION

The present invention will be described principally with reference to an implementation suitable for an implantable medical device, such as a hearing prosthesis. However, it will be appreciated that the present invention is broadly applicable to controlling power consumption in ICs. The example is intended to be illustrative, as opposed to limiting.

Figure 1:
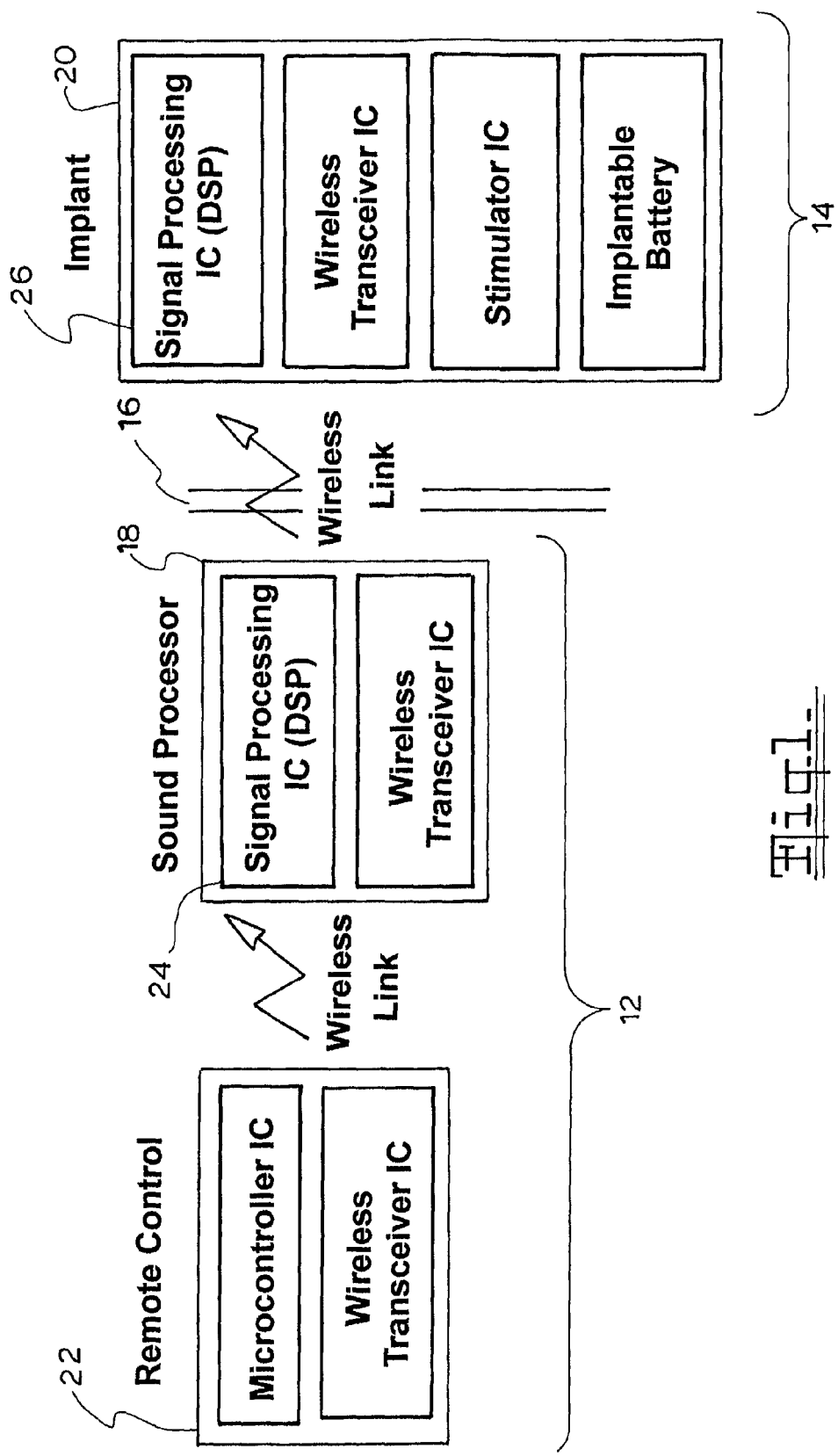
FIG. 1 shows a functional block diagram of an implantable hearing system.
Figure 2:
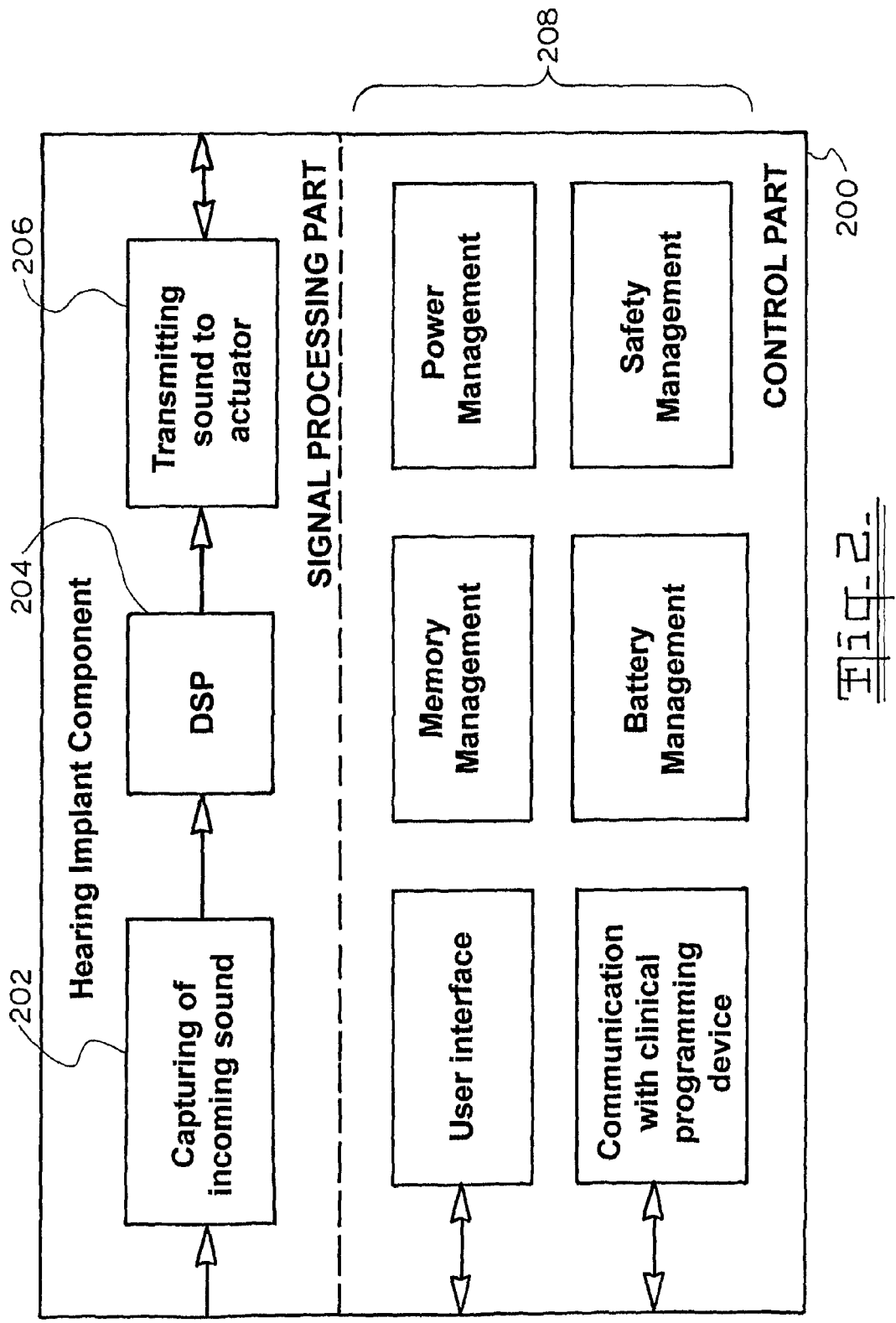
FIG. 2 shows a functional block diagram of a processor IC of the system in FIG. 1.

An example block diagram of a digital IC 200 is illustrated in FIG. 2. The signal path is separated in this IC from some control functions. The illustrated signal path consists of a block that captures the incoming sound 202, a signal processing unit (DSP) 204 and a block that outputs the sound to the actuator 206. The processor IC 200 also includes a control unit 208 that is responsible for power and battery management, memory management, safety management, and also for communication with the outside world.

The power consumption of a digital circuit in an IC depends on the switching activity of its internal nodes. In this context, the activity factor α is defined as the expected number of transitions per data cycle. If this is coupled to the average data-rate, f, which is normally equal to the clock frequency in a synchronous system, then the effective frequency of nodal charging/discharging is given by the product of the activity factor and the data rate: α*f. Combining all this gives the following formula for average CMOS power consumption of a digital circuit:

$$P_{dyn} = \alpha * f * C * VDD^2$$

in which VDD represents the supply voltage and C the total switching capacity of the circuit, which is related to the area of the circuitry, or in other words to its complexity. The combination α*C can be considered as the effective average capacity that is switching with a clock frequency f. This formula provides the foundation for low-power digital CMOS design.

Figure 3:
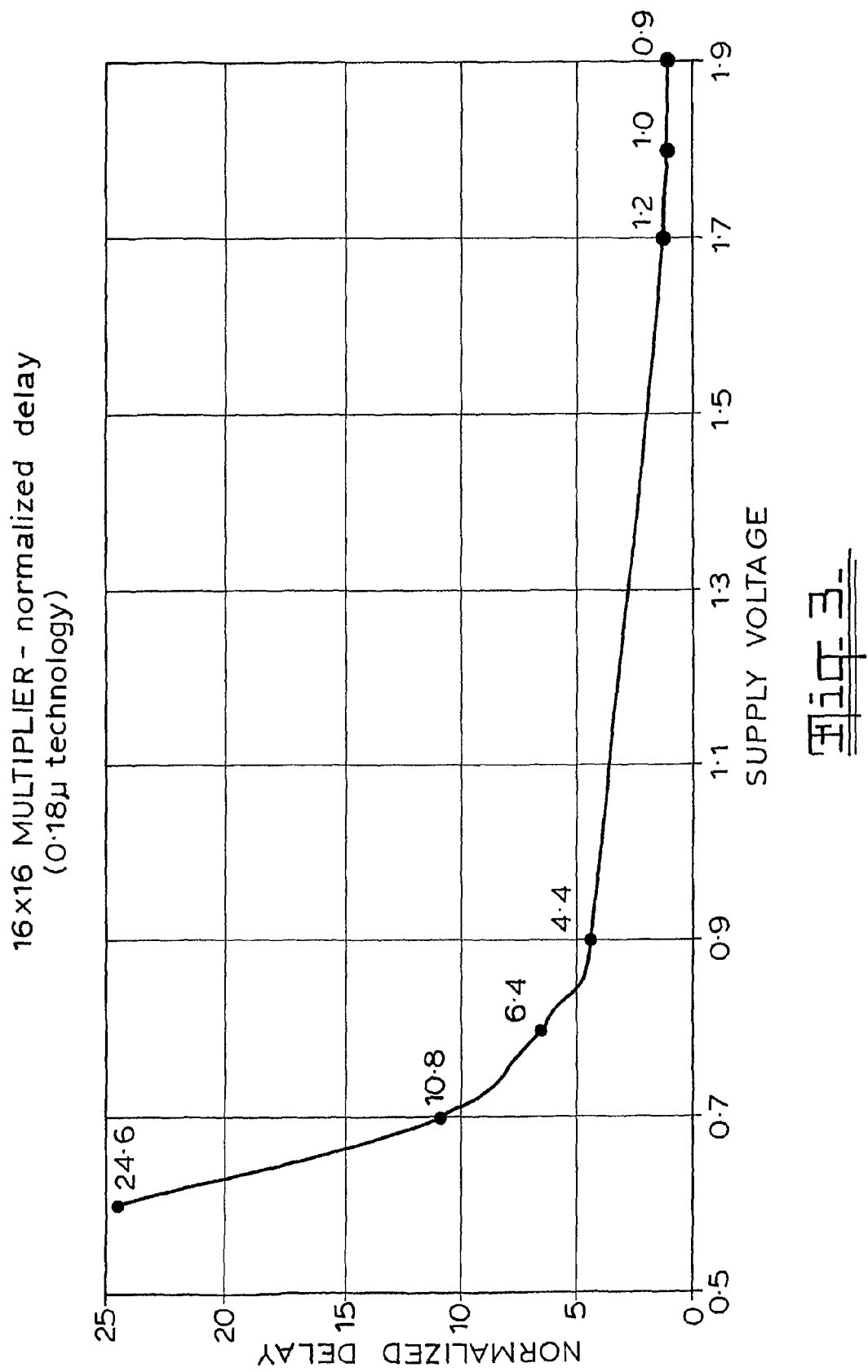
FIG. 3 shows a chart illustrating the relationship between a digital circuit delay and supply voltage level.

In summary, power usage can be reduced when the supply voltage is reduced and this with a quadratic relation: if the supply voltage is halved, 75% of the power could be saved. The drawback of this approach, however, is that the delay of the digital cells increases when the supply voltage is lowered, as shown in FIG. 3. As a result it is more difficult to meet the required timing of the circuit's intended design at lower voltages, especially under worst-case processing conditions. In addition, the timing also changes slightly at different temperatures, and because of aging of the circuit.

Figure 4:
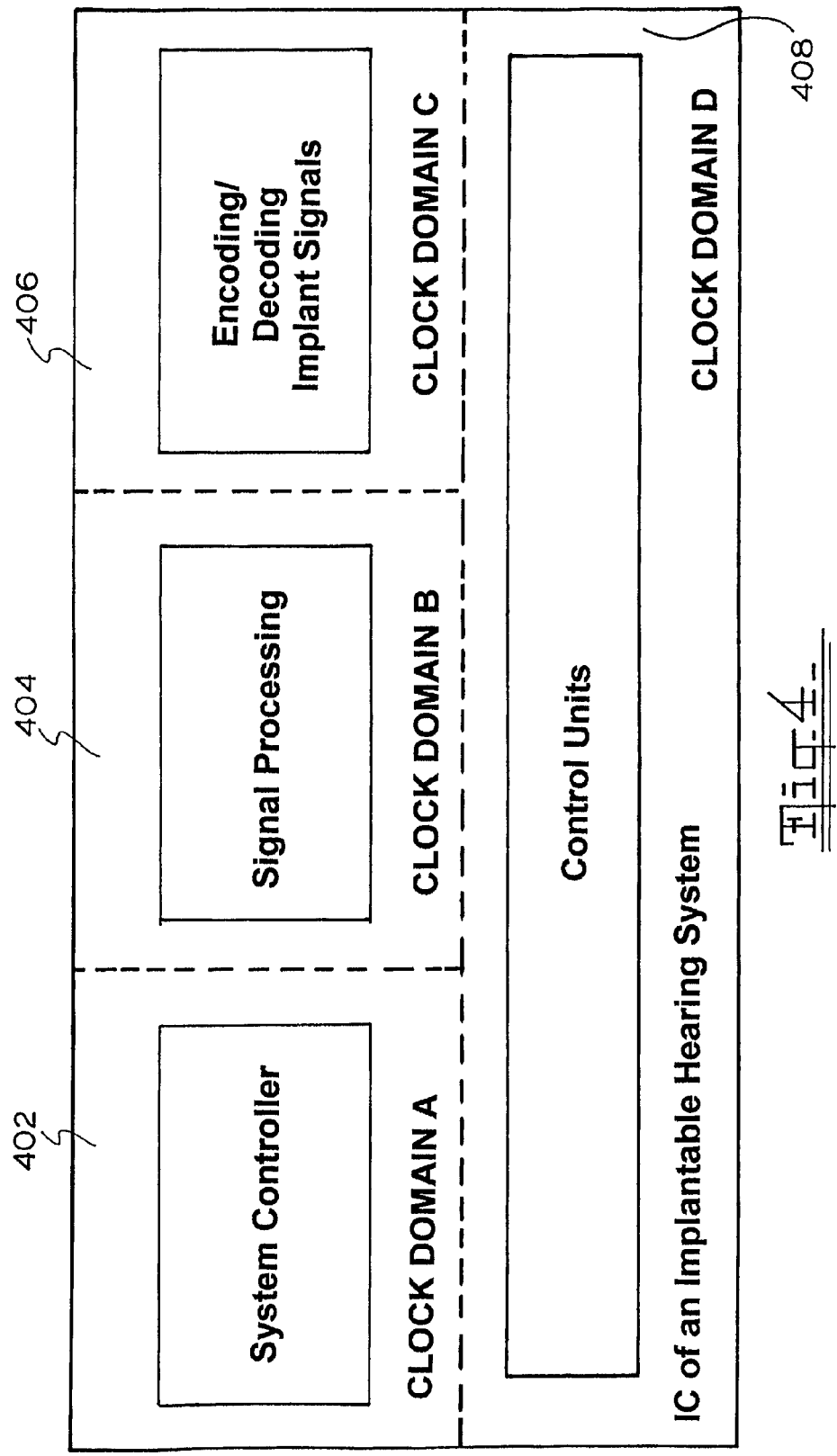
FIG. 4 shows a functional block diagram of a processor IC having a number of clock domains.

The functionality offered by a system depends on its clock speed. A DSP, for instance, that runs twice as fast can perform twice as many signal processing calculations at the same time. Some users of an implantable hearing system require much less demanding signal processing than others. As a result, the speed of signal processing units could be lowered for recipients that require less demanding signal processing. In this regard, the speed of the clocks for different signal processing blocks is made programmable on the processor IC so that the clock speed settings of the signal processing blocks can be controlled. This can be done by having several clock domains 402, 404, 406, 408 on a chip, as shown in FIG. 4.

Lowering the clock speed of the circuit design makes the timing requirements of the circuit design more relaxed. A larger delay of the digital circuit's gate cells can be accepted before the timing requirements are violated. As such, the supply voltage can be lowered if the clock speed is decreased.

Figure 5:
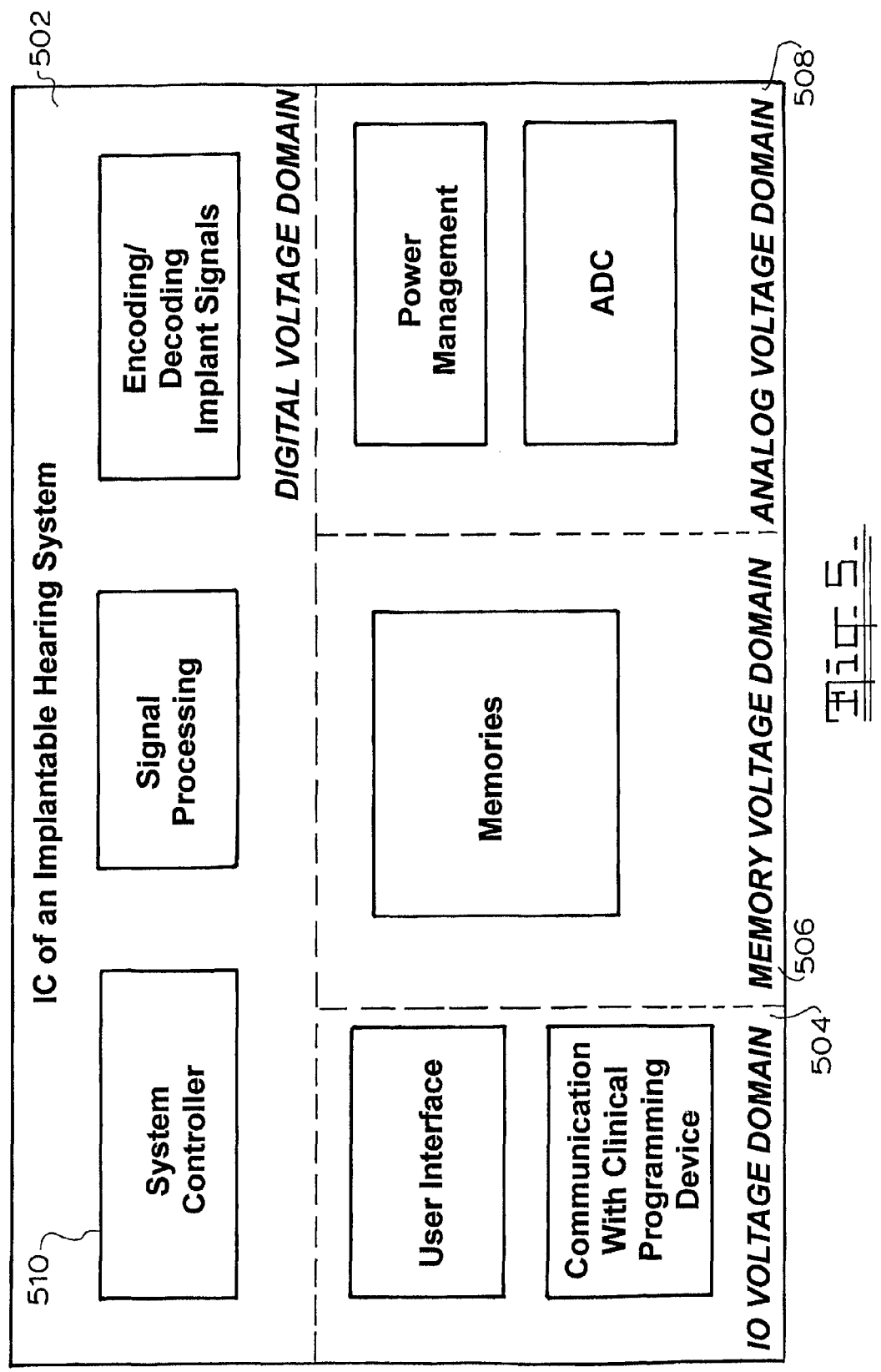
FIG. 5 shows a functional block diagram of a processor IC having a number of voltage domains.

Ideally, the IC is designed with different voltage domains 502, 504, 506, 508 so that the supply voltage can be optimized for each domain separately. FIG. 5 shows an example, in which there are four voltage domains:

Digital voltage domain 502 for the digital cells e.g. signal processing

I/O voltage domain 504 for interfacing signals

Memory voltage domain 506 for the RAM and ROM memories

Analog voltage domains 508 for the analog blocks e.g. the ADC and the IO

The IC has a separate supply domain for the digital logic 502. The supply of this digital voltage domain is programmable (e.g. range of 0.5 to 1.8V in steps of 5 OmV) and generated by a linear regulator 604. A system controller 510, e.g. a microcontroller, can program this supply voltage.

Figure 6:
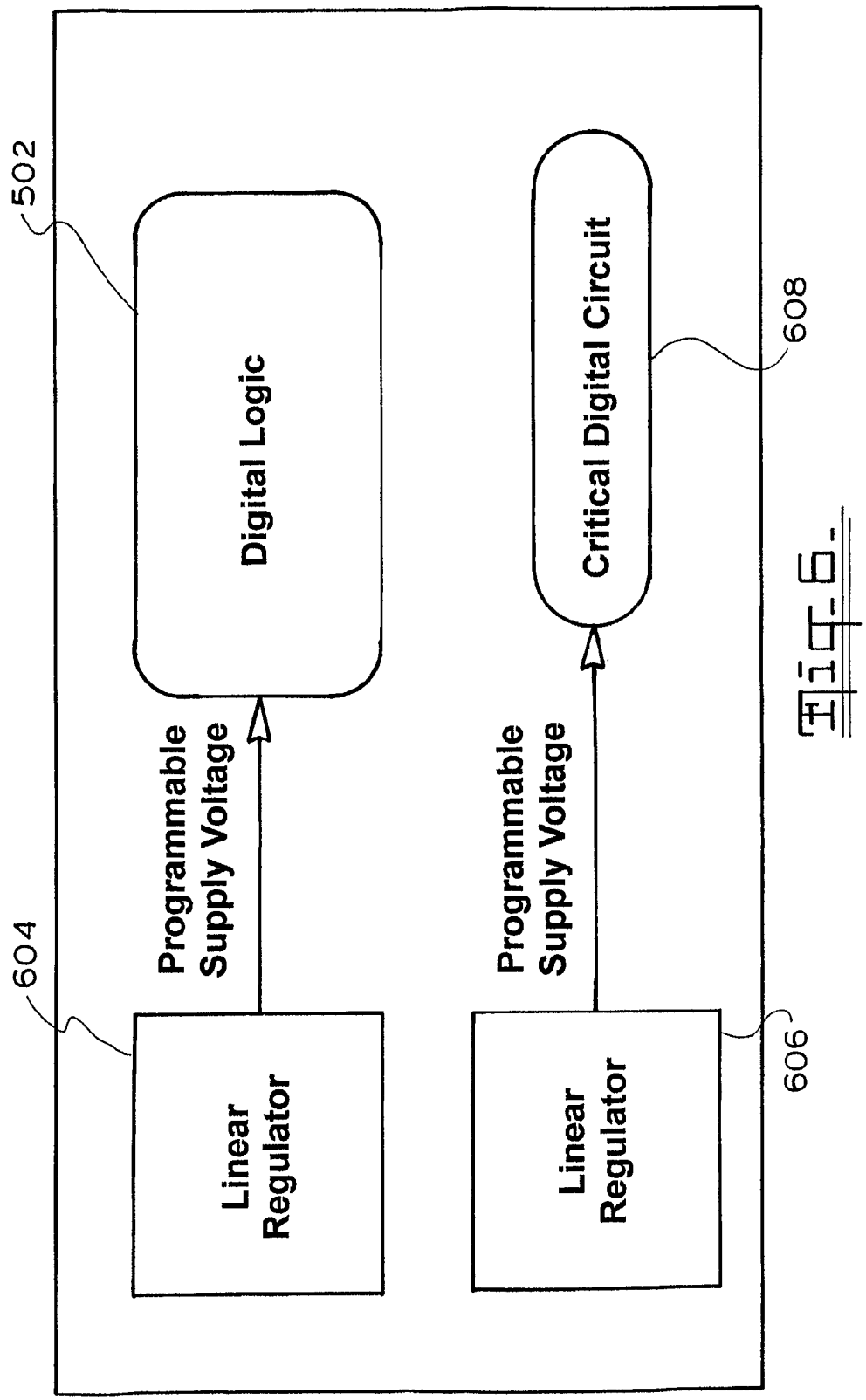
FIG. 6 shows a voltage control arrangement according to an embodiment of the present invention.

An exact copy of this linear regulator 606 is used to generate the supply of a critical digital circuit 608, i.e. a delay monitor. The system controller 510 can program the supply voltage of the delay monitor 608 independently, but exactly in the same way as it can control the digital supply voltage as shown in FIG. 6.

Figure 7:
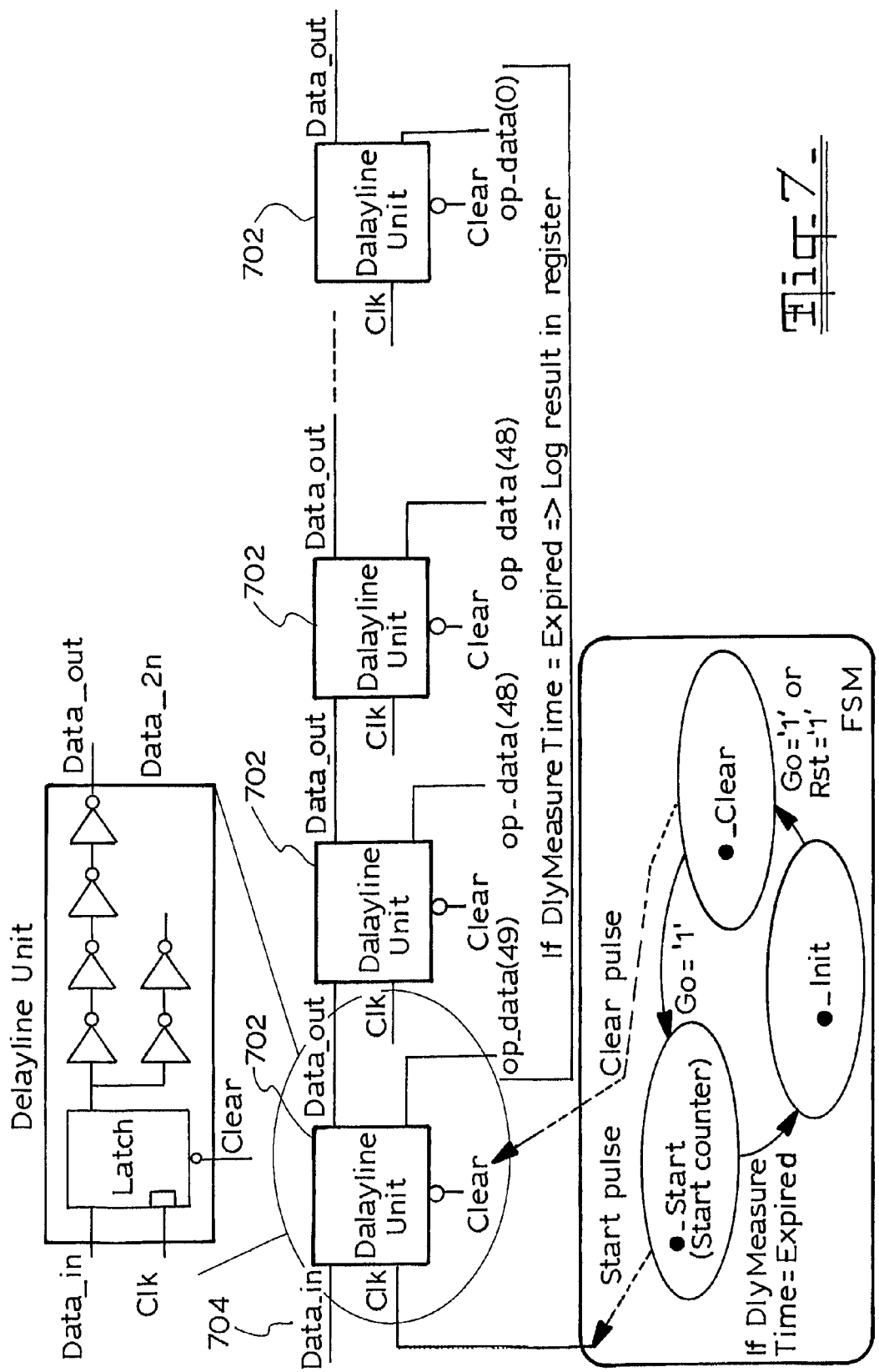
FIG. 7 shows a circuit arrangement for an embodiment of a delay monitor.

FIG. 7 shows a circuit diagram of the delay monitor 608. The delay monitor 608 measures the gate delay on the IC by counting how long it takes to calculate a critical digital circuit. The system controller 510 can start the delay monitoring at regular times.

As illustrated, the delay monitor 608 is arranged as a series of delayline units 702. Ideally, the delayline units 702 are arranged as inverters; in which case the delay monitor 608 is effectively a ring oscillator. Conceivably, the delayline units 702 could be a series of gated latches which operate as a binary counter; in which case the outputs of the delayline units 702, collectively provide an incrementing binary value.

The delay monitoring process is performed during a selected number of system clock cycles ('DlyMeasurementTime'). It will be appreciated that with a selected number of clock cycles there would be an expected output from the delayline units 702. When the measurement is started, one clock pulse is applied to the Data_in input 704 of the delay monitor circuit, thereby effecting the initiation of the binary counter. Upon the expiry of the "DlyMeasurementTime' the outputs of the delayline units 702 are checked. This gives an indication of how far the clock pulse has traveled through the delayline units during the number of clock cycles indicated by 'DlyMeasurementTime'. In other words, the binary values reached by delayline unit 702 in the measurement period is ascertained. The difference between the actual binary values achieved and the expected values gives an indication of the experienced delay. This result is communicated to the system controller 510 which, in turn, analyses the delay to determine whether and how the supply voltage should be adjusted.

At the end of the measurement period, the delayline units 702 are cleared, effectively resetting the delay monitor 608 and allowing the process to be repeated.

While the system controller 510 can adjust the supply voltage level, it is necessary to determine the limitations upon which the supply voltage can be viably adjusted. As previously explained, the acceptable delay of the digital gate cells depend on the patient's signal processing requirements or operating demands. In a lookup table, the acceptable delay can be stored for different clock settings, see FIG. 8. A start supply voltage is also stored per clock setting. At this supply voltage the circuit is guaranteed to work according to circuit design.

Figure 9:
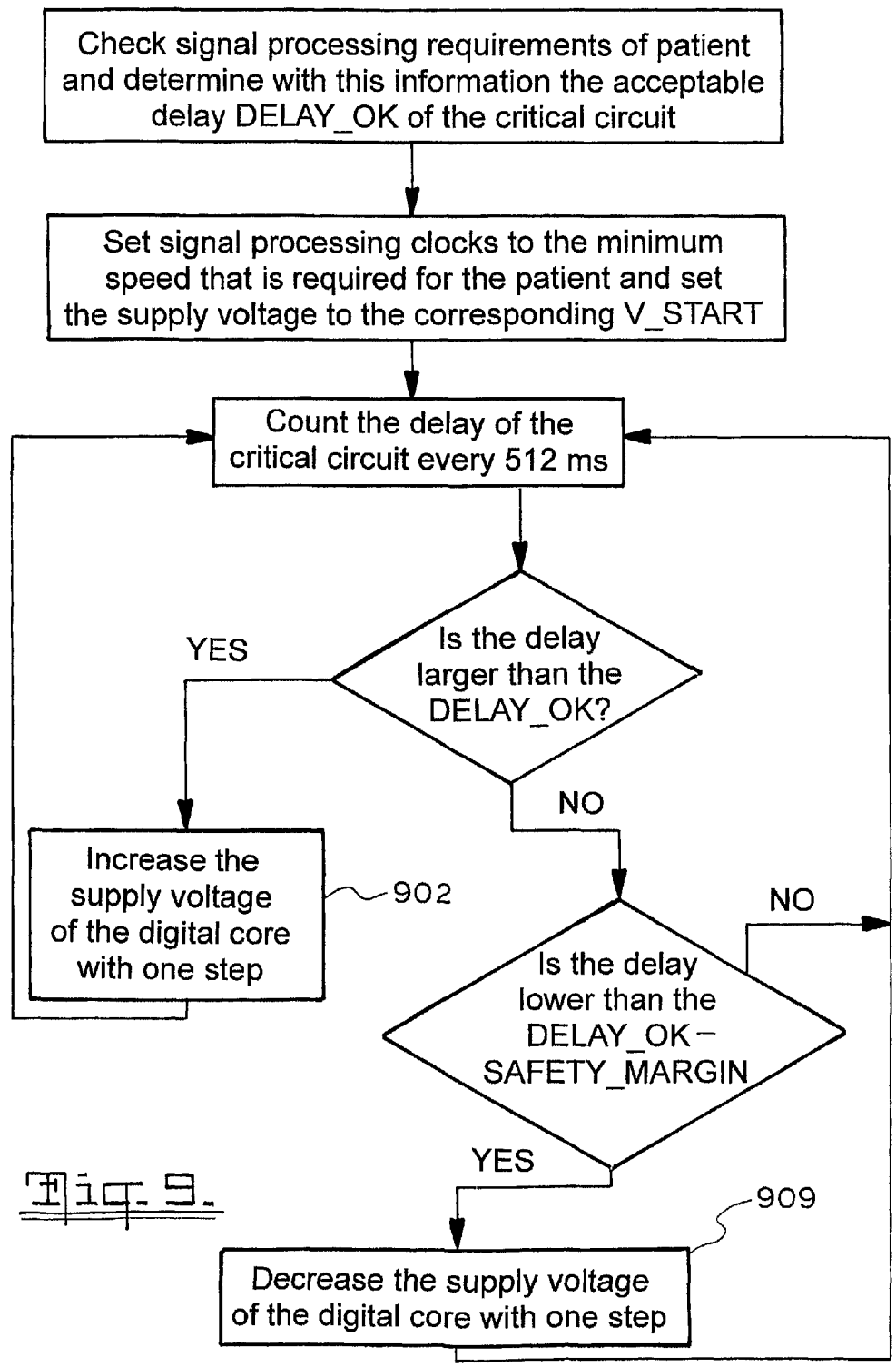
FIG. 9 illustrates a flowchart of the steps involved in supply voltage adjustment.

The process for optimal supply voltage adjustment is shown in FIG. 9. The controller will measure the delay of the delay monitor circuit regularly (e.g. every 512 ms). If the delay is above the acceptable delay, the controller will increase the supply voltage 902. If it is a below the acceptable delay minus a safety margin, then the supply voltage can be lowered 904.

As previously discussed, power consumption in an implantable hearing solution is critical, i.e. the less power consumed, the longer the batteries will last. Above that, only a limited amount of power can be drawn from the batteries and it is impossible to draw more power than this. As such, too power-hungry functions have proved undesirable to implement in prior hearing systems. This issue is addressed by the present invention by allowing optimization of the power consumed by the implantable hearing system on-the-fly. Also, there will be situations where the ambient acoustic environment is relatively uniform, and so it may be feasible to lower the clock speed in such situations. This system could also be used to assist in a soft power down situation, where the remaining power is limited and clock speed is reduced to leave at least minimal functionality as part of a graceful failure mode.

The process not only allows optimization in a static way, but also in a dynamic way. It can be used in wafer test, production test, and also during user operation.

Consideration may be given to using typical process conditions during the design, and not using worst case process conditions. The gate delay increases exponentially at low voltages. As a result the worst case conditions may be twice as bad as the typical conditions. Above that, the difference between worst case and typical condition increases at a lower supply voltage. The process allows for measuring the timing of the IC after processing. ICs that don't meet the timing, because their processing was worse than typical, can be thrown away or not used for the application. This means that during the design phase it is sufficient to work with typical process conditions and not with worst case conditions.

For submicron technologies (90 nm and smaller), more delay measurements circuits could be put on different places of the chip to cope with process variations on the chip.

While the present invention has been described with respect to specific embodiments, it will be appreciated that various modifications and changes could be made without departing from the scope of the invention. In this regard, the following are examples of conceivable variations:

The delay of another suitable form of delay reference circuit can be measured.

The measurement is done on the supply voltage itself—no copy of the supply voltage is made. In this case the arrangement works as a "guard mechanism" and the margin should be made larger.

Other power-saving parameters than supply voltage can be adapted as a result of the measurement e.g. clock settings could be decreased or less power-hungry patient settings may be selected.

The supply voltage of the IC memories can be adapted as result of a measurement (e.g. a Built-in-Self-Test or BIST).

One or more of the memory clocks can be adapted as result of a measurement (e.g. a Built-in-Self-Test or BIST).

The supply voltage of the measurement circuit is generated by a linear regulator that is not identical.

One or both supply voltages are generated in another way (e.g. a switched mode power supply).

A measurement circuit could be clocked at a different frequency to see at what clock frequency the timing is not achieved anymore.

Each processor or DSP on the chip could have its own measurement and control circuit.

The acceptable delay and start voltage can be programmed per patient in memory by the clinician, instead of storing these parameters in a lookup table.

Each memory could have its own measurement and control circuit.

Have different delay circuits at different places on the chip to control process variations over the chip.

The invention described and claimed herein is not to be limited in scope by the specific preferred embodiments herein disclosed, since these embodiments are intended as illustrations, and not limitations, of several aspects of the invention. Any equivalent embodiments are intended to be within the scope of this invention. Indeed, various modifications of the invention in addition to those shown and described herein will become apparent to those skilled in the art from the foregoing description. Such modifications are also intended to fall within the scope of the appended claims. All patents and publications discussed herein are incorporated in their entirety by reference thereto.

The invention claimed is:

1. A method for optimizing power consumption of a first digital circuit of a first voltage domain and a second digital circuit of a second voltage domain which each provides operational functionality based upon operating demands, wherein the first digital circuit is subject to a first supply voltage level and a first clock frequency and the second digital circuit is subject to a second supply voltage level and a second clock frequency, the method comprising:
   determining an acceptable delay value for the first digital circuit based upon current operating demands and the first clock frequency;
   applying the first supply voltage level and the first clock frequency to a delay monitor circuit;
   measuring the delay experienced by the delay monitoring circuit;
   comparing the measured delay with the determined acceptable delay value to determine a difference between the measured delay and the acceptable delay;
   adjusting the first supply voltage level applied to the first digital circuit based on the outcome of the comparing, wherein the adjusting comprises decreasing the first supply voltage level by an amount corresponding to the difference in response to the measured delay being less than the acceptable delay by more than a predetermined margin; and
   repeating the determining, applying, measuring, comparing, and adjusting for the second digital circuit of the second voltage domain using the second supply voltage level and the second clock frequency.

2. The method of claim 1, further comprising repeating the determining, applying, measuring, comparing, and adjusting taking into account any changes in operating parameters.

3. The method of claim 1, wherein the delay monitoring circuit is arranged as a ring oscillator including a series of inverters.

4. The method of claim 1, wherein the delay monitoring circuit is a digital counter circuit.

5. The method of claim 4, wherein the digital counter circuit includes a series a gated latches.

6. The method of claim 1, further comprising:
   selectively adjusting the first clock frequency applied to the first digital circuit based on the outcome of the comparing, wherein the selectively adjusting comprises reducing the first clock frequency by an amount corresponding to the difference in response to the measured delay being less than the acceptable delay.

7. The method of claim 1, wherein determining an acceptable delay value comprises:
referring to a prestored look-up table.

8. The method of claim 1, wherein the first supply voltage level applied to the first digital circuit and the first supply voltage level applied to delay monitoring circuit are independently generated.

9. The method of claim 1, wherein the first clock frequency applied to the first digital circuit and the first clock frequency applied to the delay monitoring circuit are independently applied.

10. The method of claim 1, wherein the first digital circuit and the delay monitoring circuit are incorporated in an integrated circuit.

11. A system for optimizing power consumption of a first digital circuit of a first voltage domain and a second digital circuit of a second voltage domain which each provides operational functionality based upon operating demands, wherein the first digital circuit is subject to a first supply voltage level and a first clock frequency and the second digital circuit is subject to a second supply voltage level and a second clock frequency, the system including:
  means for determining an acceptable delay value, from a plurality of predetermined acceptable delay values, for the first digital circuit based upon current operating demands and the first clock frequency;
  a delay monitor circuit configured to:
    have the first supply voltage level and the first clock frequency applied; and
    provide an output from which the delay experienced by the delay monitor circuit is capable of being measured, the output being based at least in part on the applied first supply voltage level and first clock frequency; and
  a supply voltage controller configured to selectively adjust the first supply voltage level applied to the first digital circuit based upon a difference between a measured delay and the determined acceptable delay by decreasing the first supply voltage level by an amount corresponding to the difference in response to determining that the measured delay is less than the determined acceptable delay, wherein the determining, applying, providing output, and selective adjusting is repeated for the second digital circuit of the second voltage domain using the second supply voltage level and the second clock frequency.

12. The system of claim 11, wherein the delay monitoring circuit is a ring oscillator including a series of inverters.

13. The system of claim 11, wherein the delay monitoring circuit is a digital counter circuit.

14. The system of claim 13, wherein the digital counter circuit includes a series of gated latches.

15. The system of claim 11, wherein the supply voltage controller is configured to iteratively decrease the first supply voltage level while the difference between the measured delay and the determined acceptable delay is greater than a predetermined margin.

16. The system of claim 11, further including a clock controller arranged to selectively adjust the first clock frequency applied to the first digital circuit based upon the difference between the measured delay and the determined acceptable delay.

17. The system of claim 11, wherein the means for determining an acceptable delay value includes a prestored look-up table.

18. The system of claim 11, wherein the first supply voltage level applied to the first digital circuit and the first supply voltage level applied to the delay monitoring circuit are applied independently.

19. The system of claim 11, wherein the first clock frequency applied to the first digital circuit and the first clock frequency applied to the delay monitoring circuit are applied independently.

20. The method of claim 1, wherein the first supply voltage level and the second voltage supply level are different, and the first clock frequency and the second clock frequency are different.

21. The system of claim 11, wherein the first supply voltage level and the second voltage supply level are different, and the first clock frequency and the second clock frequency are different.

* * * * *